United States Patent
Bruls et al.

(10) Patent No.: US 7,136,152 B2
(45) Date of Patent: Nov. 14, 2006

(54) METHOD FOR BONDING A PELLICLE TO A PATTERNING DEVICE AND PATTERNING DEVICE COMPRISING A PELLICLE

(75) Inventors: Richard Joseph Bruls, Eindhoven (NL); Joseph L. Laganza, East Norwalk, CT (US); Tammo Uitterdijk, De Bilt (NL); Herman Boom, Eindhoven (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 121 days.

(21) Appl. No.: 10/995,077

(22) Filed: Nov. 23, 2004

(65) Prior Publication Data
US 2006/0109448 A1    May 25, 2006

(51) Int. Cl.
G03B 27/62  (2006.01)
G03B 27/42  (2006.01)
G03F 9/00   (2006.01)
B31B 1/60   (2006.01)

(52) U.S. Cl. .............................. 355/75; 355/53; 430/5; 156/60

(58) Field of Classification Search .................. 355/53, 355/75; 430/5; 156/60, 325
See application file for complete search history.

(56) References Cited

U.S. PATENT DOCUMENTS

| | | | |
|---|---|---|---|
| 5,576,125 A * | 11/1996 | Bih | 430/5 |
| 5,772,817 A * | 6/1998 | Yen et al. | 156/73.1 |
| 6,727,029 B1 * | 4/2004 | Wu et al. | 430/5 |
| 2004/0194556 A1 * | 10/2004 | Shu et al. | 73/862.045 |
| 2005/0045262 A1 * | 3/2005 | Eschbach et al. | 156/60 |

* cited by examiner

*Primary Examiner*—Alan Mathews
(74) *Attorney, Agent, or Firm*—Pillsbury Winthrop Shaw Pittman LLP (57) ABSTRACT

A method is provided to reduce differences between the way in which reticle chucking forces and gravity force act upon the reticle during use and during assembly of the pellicle, and to combine this with a similar reduction concerning pellicle chucking forces and gravity force acting upon the pellicle during bonding to the reticle and during quality control of the pellicle. The shape of the pellicle is measured for control in the same orientation of the pellicle with respect to gravity force as during use of the pellicle, and during bonding the pellicle and the reticle are held in the same way and in the same orientation as during control of the pellicle and use of the reticle in the lithographic apparatus, respectively.

16 Claims, 4 Drawing Sheets

FIG. 2

FIG. 4

METHOD FOR BONDING A PELLICLE TO A PATTERNING DEVICE AND PATTERNING DEVICE COMPRISING A PELLICLE

FIELD

The present invention relates generally to patterning devices for use with a lithographic apparatus and to pellicles for use therewith.

BACKGROUND OF THE INVENTION

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In optical projection lithography protection against particulate contamination of a patterning device surface carrying (or arranged to form) a pattern to be projected onto the substrate is typically realized by providing that surface with a pellicle. A pellicle generally comprises a pellicle membrane (a sheet or foil) transmissive for radiation used for exposure and a frame carrying the pellicle membrane. The frame carrying the pellicle membrane is bonded to, for example, a reticle surface so that the membrane is disposed at a distance from the patterned surface. In the presence of the pellicle, particulate contaminants cannot reach that surface, and hence stay out of focus during use of the reticle in the apparatus. The pellicle membrane can, for example, be a polymeric membrane or a fused silica membrane. Pellicles of the latter type are commonly referred to as "hard" pellicles. A pellicle membrane (a polymeric membrane or a hard pellicle membrane) acts as a refractive optical element on the projection beam, and therefore control of the shape of the refracting surfaces of the membrane is critical. For example, a non flat pellicle membrane shape may cause out of tolerance image errors of an image of the pattern, as projected onto the substrate. These image errors comprise optical aberrations such as, for example, distortion and defocus. Attachment of a pellicle to a reticle may also cause deformations of the reticle, which in turn cause similar image errors.

Pellicles are manufactured separate from lithographic apparatus, in accordance with specifications concerning maximum allowable deviations from a nominal shape of the pellicle membrane surface. Control of surface shape of the pellicle membrane is particularly critical with the use of hard pellicles, because generally hard pellicles are thicker than polymeric membranes, and may therefore act more strongly as a refractive optical element on the projection beam than the relatively thin polymeric membranes. For increasing Numerical Aperture (NA) of the projection system of the apparatus, the control of shape of the pellicle membrane becomes even more critical, and there is the problem of complying with pellicle-shape specifications not only after manufacture of a pellicle but also during use of the pellicle combined with a reticle, in a lithographic apparatus, while maintaining any reticle deformation, due to attachment of a pellicle to the reticle, within tolerance.

SUMMARY OF THE INVENTION

It is desirable to provide a method for bonding a pellicle on a patterning device for use with a lithographic apparatus whereby detrimental effects of pellicle attachment to a patterning device and pellicle shape deviations during use of a pellicle are alleviated.

According to an aspect of the invention there is provided a method for bonding a pellicle, having a membrane with a radiation transmissive area, to a patterning device for use with a lithographic apparatus, the membrane being disposed at a distance from the patterning device, the method comprising:

holding the patterning device in the same way and in the same orientation with respect to gravity force as during use in said lithographic apparatus;

holding the pellicle in the same way and orientation as during a control of the shape of the pellicle membrane whereby the orientation of the pellicle with respect to gravity force is the same as during use of the pellicle in said lithographic apparatus;

bonding the pellicle to the patterning device using an adhesive, and keeping the patterning device in said orientation during at least part of a curing of the adhesive.

According to another aspect of the invention, there is provided a patterning device for use with a lithographic apparatus, the patterning device comprising a surface for providing a pattern and a pellicle having a membrane with a radiation transmissive area, the membrane being disposed at a distance from said surface, the patterning device having mechanical properties which, when the patterning device is held by a patterning device holder of said lithographic apparatus, provide a desired shape to said surface and the membrane, whereby said mechanical properties are imparted to the patterning device comprising said pellicle by bonding said pellicle to the patterning device in accordance with the method described above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

A pellicle for use with a reticle is bonded to a reticle at a bonding site separate from the lithographic apparatus. In addition to tooling for bonding the pellicle to the reticle, appropriate tooling for the qualification of the shape of the pellicle surfaces within said radiation transmissive area is used for the manufacture and quality control of the pellicle. Before bonding, both the reticle shape and pellicle shape are within tolerance in accordance with specifications defining maximum allowable deviations from nominal shape of the reticle and pellicle surfaces. After said bonding, a qualification of surface shapes of the reticle and pellicle is executed using, for example, an interferometer. Generally, a lithographic apparatus is embodied such that in use a patterning device, such as for example a reticle, is held in a horizontal orientation by a support constructed to support the patterning device or reticle. However, in principle, the orientation of a reticle during use for projection of a pattern can be any preselected orientation. For example, lithographic apparatus are known where in use the reticle is held in a vertical orientation. Differences between orientation of the pellicle during use in the lithographic apparatus and during bonding to the reticle and/or testing at a qualification site cause image distortion of the projected image in the lithographic apparatus which may well be out of tolerance, due to differences in which chucking forces gravity acts on the reticle and the pellicle in the two respective cases.

Figure 1:
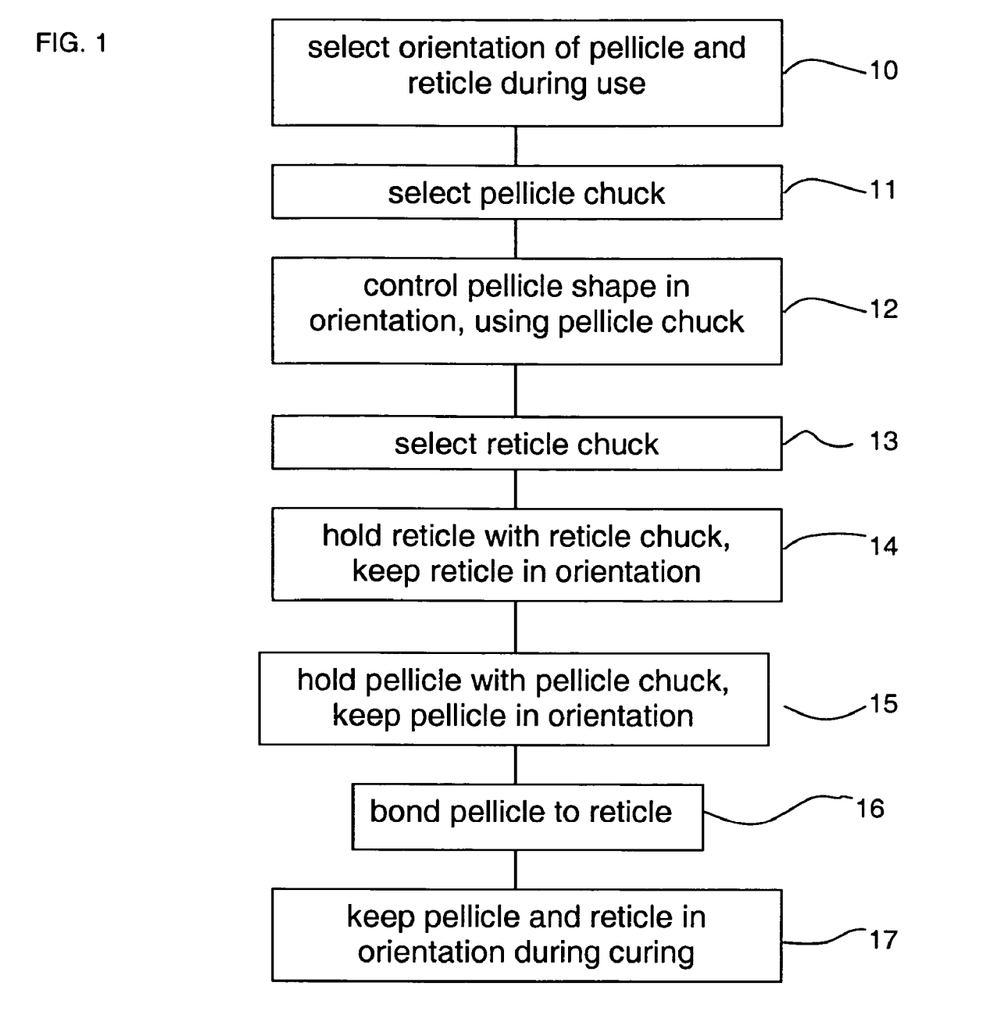
FIG. 1 depicts a flow scheme indicating steps characteristic for the method according to the invention.

The present method is schematically illustrated by the actions in the flow diagram in FIG. 1. The basic principle of the present method is to reduce any differences between the way in which reticle chucking forces (i.e. forces caused by a holder for holding the reticle) and gravity force act upon the reticle during use, and during assembly of the pellicle (actions 14–17), and to combine this with a reduction of any differences between the way in which pellicle fucking forces (i.e. forces caused by a holder for holding the pellicle, the holder being a selected pellicle chuck, see action 11) and gravity force act upon the pellicle during bonding to the reticle (action 16) and curing of the adhesive (action 17) at the one hand and during quality control of the pellicle (action 12) at the other hand.

In the present embodiment, these effects are provided by performing the steps 10–17 of FIG. 1. The shape of the pellicle (during manufacturing and/or before bonding it to the reticle) is measured for control, action 12, in the same orientation of the pellicle with respect to gravity force as during use of the pellicle. The use of the pellicle defines an orientation of the pellicle, and this orientation is generally the same as the orientation of the reticle, as indicated in step 10. Here as well as in action 13 "select" may refer to using the method in relation to a selected, specific type of lithographic apparatus. Similarly, the "select" in action 11 refers to using the present method in relation to a selected, specific pellicle test- and qualification-tool, part of which is a specific type of pellicle chuck. For the bonding action 16, the reticle is held in the same way and in the same orientation with respect to gravity force as during use in the lithographic apparatus, as indicated by action 13 and 14. Similarly the pellicle is held in the same way and orientation as during the controlling of the shape of the pellicle, as indicated by actions 11 and 15. After moving the reticle and the pellicle proximate to each other for bonding the pellicle to the reticle using an adhesive, this adhesive can cure or harden while keeping the reticle in said orientation during at least part of the curing of the adhesive, as indicated by action 17. For example, an UV curable adhesive can be used. Consequently, the effects of pellicle shape deviations during use of a pellicle can be alleviated, resulting in a reduction of image distortions.

It is desirable to monitor the shape of the patterning device surface which carries or provides the pattern during bonding in order to detect a change of shape of this surface for control of and to avoid undesirable shape changes of the patterning device and/or the pellicle during one or more of the steps 14–17 in FIG. 1. In an embodiment of the invention the shape of the reticle pattern surface is monitored using an interferometer, while moving proximate to each other the reticle and the pellicle. The interferometer is arranged to detect a change of shape of the reticle; once a change is detected, the reticle and the pellicle are moved away from each other until the reticle surface shape returns to its initial shape. The resulting relative position of the pellicle with respect to the reticle is stored for allowing returning to this position (or, optionally, this position including a preselected offset) after providing adhesive to, for example, the pellicle at suitable locations for bonding. The effect is that detrimental reticle shape changes after bonding are avoided.

As mentioned above, generally the orientation of the pellicle in use is the same as the orientation of the reticle, i.e. the pellicle membrane and the reticle surfaces are parallel. However, the invention is equally well applicable to a situation where the pellicle or at least the membrane of the pellicle is tilted with respect of the reticle surfaces (for example to alleviate the problem of ghost images). Further, said "the reticle is held in the same way" is referring to any way of holding the reticle such that chucking forces exerted on the reticle during step 14 in FIG. 1 are substantially the same as when in use in the lithographic apparatus. Thus, when in the lithographic apparatus a vacuum, electrostatic or other clamping technique is used, the corresponding interface with the provisions embodying these techniques can be reproduced in an embodiment of the chuck for holding the reticle as indicated in step 13 of FIG. 1. Similarly, said "the pellicle is held in the same way" is referring to any way of holding the pellicle such that chucking forces exerted on the pellicle during step 15 in FIG. 1 are substantially the same as during quality control of the pellicle membrane shape, see step 12 in FIG. 1. Such substantially the same chucking forces exerted, as mentioned above, can be obtained by providing a holder for holding the patterning device with a holding interface for the patterning device which is equal to a corresponding holding interface of a patterning device holder of said lithographic projection apparatus, and similarly, for the pellicle, by providing a holder for holding the pellicle with a holding interface for the pellicle which is equal to a corresponding holding interface of pellicle holder which is part of a tool used for said controlling of the shape of said pellicle membrane.

Figure 2:
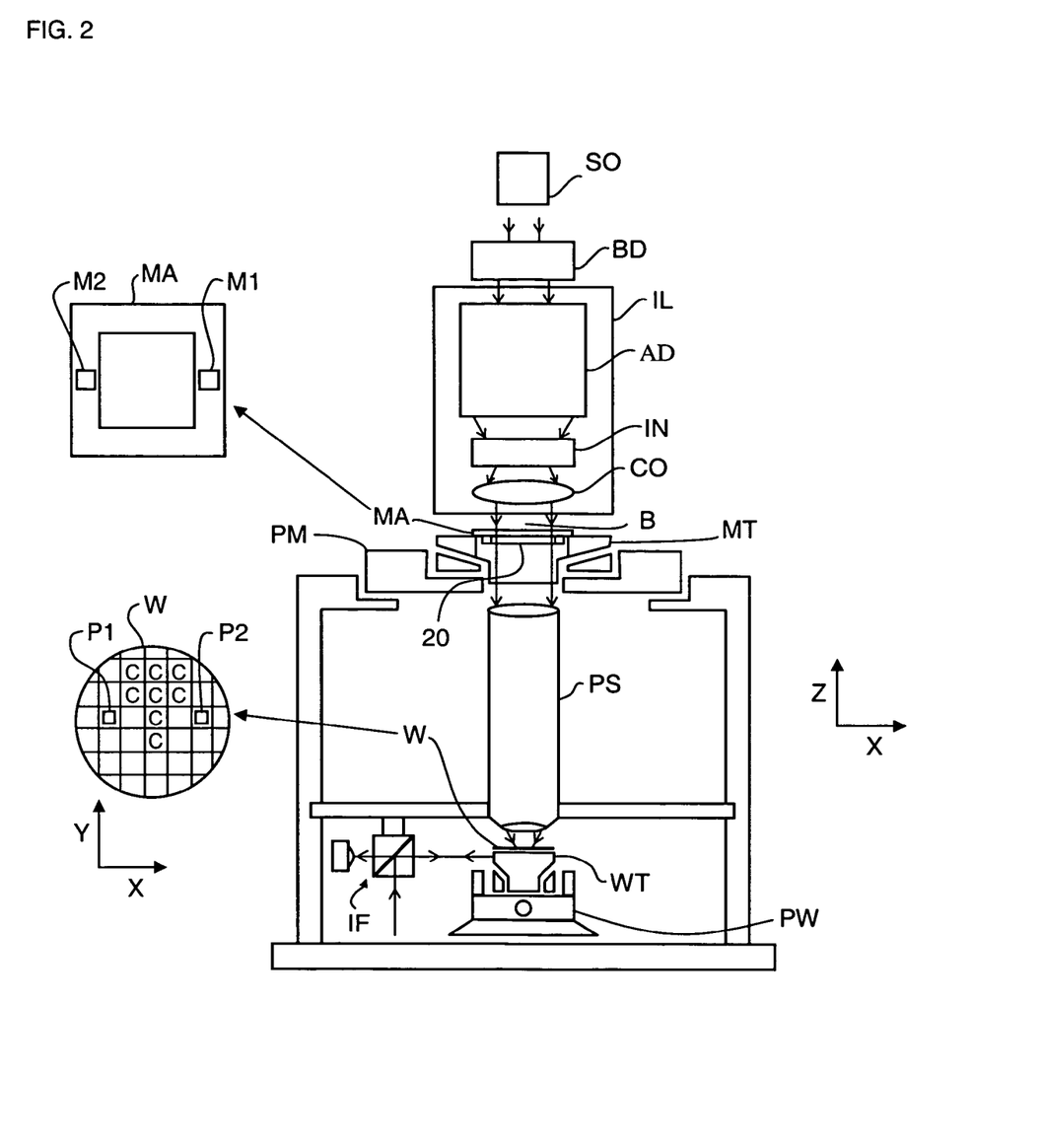
FIG. 2 depicts a lithographic apparatus according to an embodiment of the invention.

FIG. 2 schematically depicts a lithographic apparatus according to the present embodiment of the invention. The apparatus comprises:

- an illumination system (illuminator) IL configured to condition a radiation beam B (e.g. UV radiation or DUV radiation of a wavelength of less than about 270 nm, such as wavelengths of 248, 193, 157, and 126 nm radiation).
- a support structure (e.g. a mask table or "reticle chuck") MT constructed to support a patterning device (e.g. a mask) MA and connected to a first positioner PM configured to accurately position the patterning device in accordance with certain parameters;

a pellicle 20 bonded to the mask MA;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 2, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Due to changes occurring in the adhesive during curing or hardening, such as for example volume-shrink, the bonding process for bonding the pellicle to the reticle is very critical with respect to introducing deformations of either the reticle or the pellicle. According to an aspect of the invention the pellicle comprises a mounting interface for fixation to the patterning device, and the bonding comprises disposing adhesive at two or more separate, isolated areas between the patterning device and the mounting interface. The mounting interface may be embodied as a surface of a frame, in use facing the patterned surface of the reticle, the frame having an aperture traversed by—in use—the beam B of radiation and serving as carrier for a pellicle membrane (i.e. a foil or sheet of transmissive material). To avoid direct contact between the patterning device and the mounting interface the setting of a space between the patterning device and the mounting interface can be provided. In principle it is sufficient to apply two dots of adhesive at two corresponding isolated areas with the effect that changes occurring in the dots of adhesive during hardening have minimum impact (and if any, than only at a limited number of areas), on the shape of the reticle and the pellicle. The space between the mask and the mounting interface surface shall be set such that any substantial direct contact between the mask and the interface surface is avoided, because any such substantial direct contact could lead to unintended deformations of the reticle and/or the pellicle. It is possible to purposively provide some points of direct-contact functioning as spacers to define and set the size of the space between the mask and the frame-to-mask interface surface.

Figure 3:
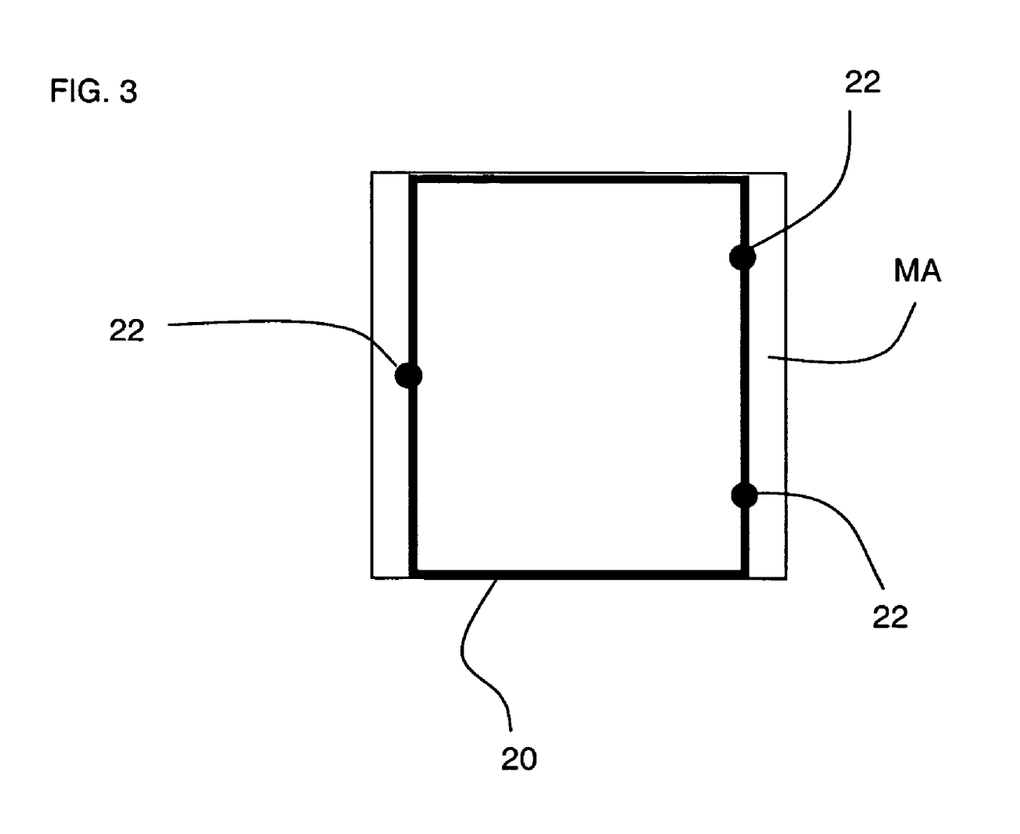
FIG. 3 depicts a top view of a reticle provided with a pellicle according to a three point fixation method.

The invention is particularly applicable where a three point mount principle is used by disposing adhesive at three isolated areas between the patterning device and the mounting interface, said areas located at corners of a notional triangle. In FIG. 3 a top view of a reticle MA provided with a pellicle 20 is shown. Adhesive is applied at three locations 22. For example, in accordance with step 10 (FIG. 1) the three point fixation takes place with the reticle and the pellicle both in a horizontal (or close to horizontal orientation), applying the method in relation to a lithographic apparatus as depicted in FIG. 2. In a particular arrangement, the three points 22 are to be chosen such that the center of mass of the pellicle is located within the triangle. This improves stability of the bonding procedure.

Figure 4:
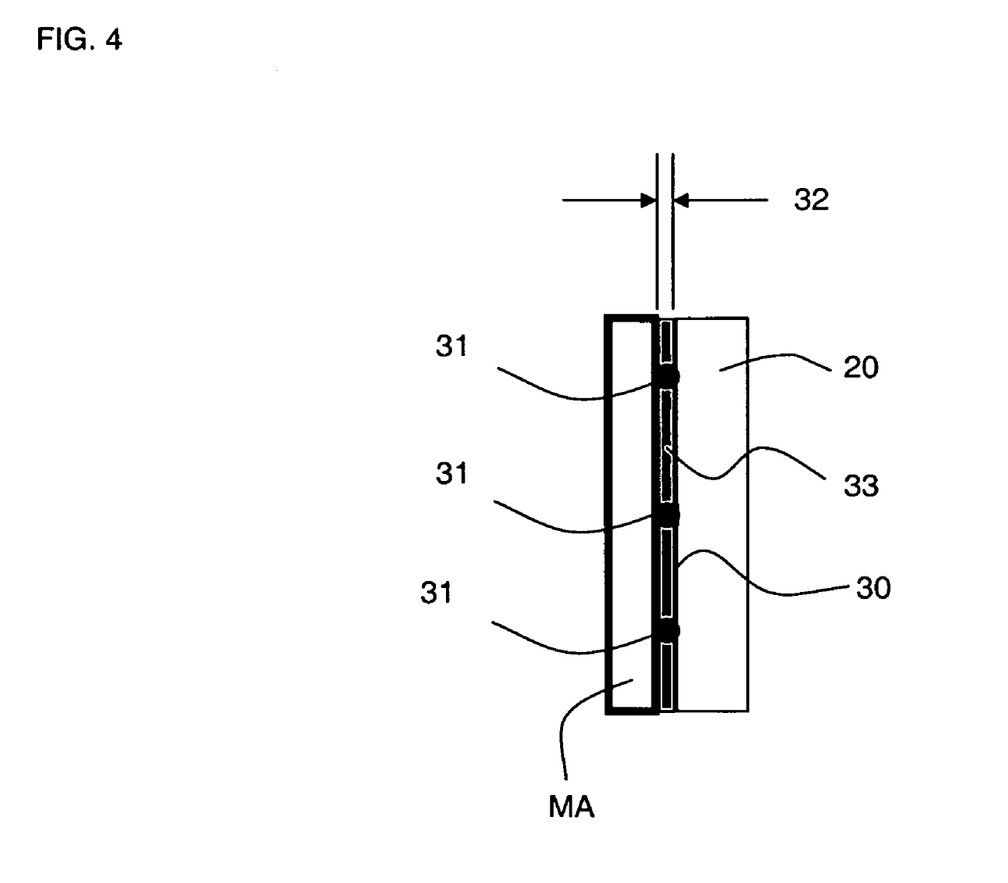
FIG. 4 depicts a side view of a pellicle bonded to a reticle, and provided with a sealing applied by capillary action.

According to the present method, and as illustrated in FIG. 4, the mask MA and the pellicle mounting interface surface 30 are brought together with adhesive 31 disposed there between at the preselected three isolated areas 22 between the mask and the interface surface until a certain preselected space 32 between the mask and the interface surface is reached. This space may be referred to hereinafter as the mounting gap 32, and serves to avoid any substantial direct contact between the mask and the interface surface 30 that could cause deformations of the pellicle and/or the reticle. To control the dimension of the mounting gap 32 the adhesive may, for example, be pre-mixed with commercially available glass pearls (or balls of solid material) with a preselected maximum diameter, in which case one or more of such glass balls will ultimately, at each adhesive dot position, determine the space between the mask and the interface surface 30, limit a movement of the mask and the pellicle towards each other. Alternatively, spacers of a preselected thickness (for example of sheet material) or small sized elements of the interface surface over the interface surface at a preselected height (or small reticle elements protruding over the reticle surface) can be used to similarly limit and determine the space between the mask and the interface surface during curing of the adhesive dots 31. The mounting gap 32 accommodates for reticle and mounting interface surface or pellicle frame non-flatness, and the effect is that the only substantial connection between reticle and frame is made by the three adhesive dots.

In optical projection lithography control of environment and contamination along the path traversed by the radiation beam is critical. For 193 nm and 157 nm DUV apparatus spaces traversed by the radiation beam are gas purged to alleviate the effects of contamination of optical elements (for example due to radiation induced deposit of hydro carbons) and/or absorption of radiation (due to the presence of for example water vapour or oxygen). The space between the pellicle foil or membrane and the patterned surface of the reticle is to be purged for reasons mentioned above. To enable purging of this space the pellicle frame can be made of a porous material, so that a purge-gas stream through the pores can be established. Such porous frames may have a filter function as well for filtering out possible particulate contaminants present in the purge gas. Consequently, above mentioned space between the mask and the mounting interface surface shall, upon curing of the adhesive dots, be filled and closed to prevent contamination. An embodiment of a sealed reticle pellicle assembly is illustrated in FIG. 4. The filling can conveniently be realized by applying a glue 33 at areas other than said separate isolated areas using capillary infiltration of glue 33 in the mounting gap 32 between the mask MA and the interface surface 30. The curing of the adhesive dots 31 is followed by a step comprising applying glue 33 at areas other than said separate isolated areas. The glue 33 is selected to have a viscosity suitable for obtaining capillary infiltration by the glue 33 into the mounting gap 32.

Application of the glue 33 for capillary infiltration is typically done with tooling that is incompatible with tooling and/or chucks needed for holding in place the reticle and the pellicle during curing of the adhesive dots 31. Therefore, the reticle MA with the three point mounted pellicle 20 is removed from said holders after sufficient curing of the adhesive dots 31. However, fixation on three points is not sufficient to prevent bending due to gravity of parts of the pellicle such as for example a membrane carrying frame when the chuck for holding the pellicle in place is removed. In order to minimize resulting deformations one can, after sufficient curing of the adhesive dots 31, and before applying glue for sealing the reticle-frame gap 32, position the mask/pellicle assembly in a substantially vertical position. A subsequent application and curing of the capillary infiltrating glue 33 now does not cause detrimental effects on the shape of the reticle and/or the pellicle.

It is an aspect of the invention to provide an alternative method for bonding a pellicle to a mask for use with a lithographic apparatus, whereby application of the capillary glue 33 can be omitted. With this method said disposing adhesive at two or more separate, isolated areas between the mask and the interface surface comprises applying substantially equal amounts of adhesive at a plurality of evenly spaced isolated areas between the mask and the interface surface, followed by reducing the space between the mask and the interface surface such as to form a continuous film of adhesive, while avoiding any substantial direct contact between the mask and the interface surface. In case small pores are expected or confirmed to be present, a further capillary filling of residual openings or pores can be applied. In view of the more circumferential bonding by the adhesive compared to the bonding obtained with applying only a few adhesive dots it is not necessary to do this step in a vertical orientation.

According to an aspect of the invention, there is provided a patterning device for use with a lithographic apparatus, the patterning device comprising a surface for providing a pattern and a pellicle having a membrane with a radiation transmissive area, the membrane being disposed at a distance from said surface, the patterning device having mechanical properties which, when the patterning device is held by a patterning device holder of said lithographic apparatus, provide a desired shape to said surface and the membrane, whereby said mechanical properties are imparted to the patterning device comprising said pellicle by bonding said pellicle to the patterning device in accordance with the method of the present invention. Although the shape of the pellicle and reticle surfaces may be beyond tolerance when the reticle MA with the pellicle 20 is not in use and not held by the mask table MT, according to the present invention the reticle-pellicle assembly may nevertheless be within shape tolerance when in use.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention, where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5–20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed:

1. A method for bonding a pellicle having a membrane with a radiation transmissive area, to a patterning device for use with a lithographic apparatus, the method comprising:
    holding the patterning device in substantially a same orientation with respect to gravity and in substantially a same manner as during use in the lithographic apparatus;
    holding the pellicle in substantially a same manner and orientation as during a control of a shape of the pellicle membrane and in substantially a same orientation with respect to gravity as during use of the pellicle in the lithographic apparatus;
    bonding the pellicle to the patterning device using an adhesive; and
    keeping the patterning device in said orientation during at least part of a curing of the adhesive.

2. A method according to claim 1, wherein the pellicle comprises a mounting interface for fixation to the patterning device, the bonding further comprising disposing adhesive at two or more isolated areas between the patterning device and the mounting interface and setting a space between the patterning device and the mounting interface to avoid direct contact between the patterning device and the mounting interface.

3. A method according to claim 2, wherein adhesive is disposed at three isolated areas between the patterning device and the mounting interface.

4. A method according to claim 2, wherein said curing of the adhesive is followed by applying glue at areas other than said isolated areas, using capillary infiltration of glue between the patterning device and the mounting interface.

5. A method according to claim 4 further comprising, after the curing and before the applying glue at areas other than said isolated areas, positioning the patterning device in a substantially vertical position.

6. A method according to claim 1, wherein a holder for holding the patterning device is provided with a holding interface for the patterning device which is substantially the same as a corresponding holding interface of a patterning device holder of said lithographic projection apparatus.

7. A method according to claim 1, wherein a holder for holding the pellicle is provided with a holding interface for the pellicle which is substantially the same as a corresponding holding interface of pellicle holder which is part of a tool used for said control of the shape of said pellicle membrane.

8. A method according to claim 2, wherein the disposing adhesive further comprises applying substantially equal amounts of adhesive at a plurality of evenly spaced isolated areas between the patterning device and the mounting interface, and wherein the setting a space further comprises reducing the space between the patterning device and the mounting interface to form a continuous film of adhesive.

9. A method according to claim 2, wherein the setting a space between the patterning device and the mounting interface comprises adding to the adhesive, glass particles with a size distribution featuring a preselected maximum size for defining the space between the patterning device and the mounting interface.

10. A method according to claim 1, wherein the patterning device comprises a patterning device surface for providing a pattern, and wherein the bonding of the pellicle to the patterning device comprises:
   moving proximate to each other the patterning device and the pellicle;
   monitoring the shape of said patterning device surface during said moving to detect a change of shape; and
   moving away from each other, over a distance resulting in the change of shape being absent, the patterning device and the pellicle in response to said detected change of shape.

11. A method according to claim 1, wherein the patterning device comprises a patterning device surface for providing a pattern, and wherein the bonding of the pellicle to the patterning device further comprises monitoring a shape of said patterning device surface during said bonding.

12. A method according to claim 2, wherein the patterning device comprises a patterning device surface for providing a pattern, and wherein the bonding of the pellicle to the patterning device further comprises:
   monitoring a shape of said patterning device surface during said bonding, and
   monitoring a shape of the membrane during said bonding.

13. A patterning device for use with a lithographic apparatus, the patterning device comprising a surface for providing a pattern and a pellicle having a membrane with a radiation transmissive area, the membrane being disposed at a distance from said surface, the patterning device having mechanical properties which, when the patterning device is held by a patterning device holder of said lithographic apparatus, provide a desired shape to said surface and the membrane, wherein said mechanical properties are imparted to the patterning device comprising said pellicle by bonding said pellicle to the patterning device in accordance with a method for bonding a pellicle having a membrane with a radiation transmissive area, to a patterning device for use with a lithographic apparatus, the method comprising:
   holding the patterning device in substantially a same orientation with respect to gravity and in substantially a same manner as during use in the lithographic apparatus;
   holding the pellicle in substantially a same manner and orientation as during a control of a shape of the pellicle membrane and in substantially a same orientation with respect to gravity as during use of the pellicle in the lithographic apparatus;
   bonding the pellicle to the patterning device using an adhesive; and
   keeping the patterning device in said orientation during at least part of a curing of the adhesive.

14. A method for bonding a pellicle having a membrane with a radiation transmissive area, to a patterning device for use with a lithographic apparatus, the method comprising:
   holding the patterning device in substantially a same orientation with respect to gravity and in substantially a same manner as during use in the lithographic apparatus;
   holding the pellicle in substantially a same manner and orientation as during a characterization of a shape of the pellicle membrane and in substantially a same orientation with respect to gravity as during use of the pellicle in the lithographic apparatus;
   bonding the pellicle to the patterning device using an adhesive; and
   keeping the patterning device in said orientation during at least part of a curing of the adhesive.

15. A method for operating a lithographic apparatus comprising:
   holding a patterning device, having a pellicle bonded thereto, in a selected patterning device holding manner with a selected patterning device orientation with respect to gravity, such that the pellicle has a selected pellicle orientation with respect to gravity;
   patterning a beam of radiation using the patterning device; and
   projecting the beam of radiation onto a target area of a substrate,
   wherein when the pellicle is bonded to the patterning device, the patterning device is held in the selected patterning device holding manner and the selected patterning device orientation with respect to gravity and the pellicle is held with a selected pellicle orientation with respect to gravity.

16. A method according to claim 15, further comprising:
   before the bonding, characterizing the pellicle while holding it in a selected pellicle holding manner and in the selected pellicle orientation with respect to gravity; and
   during the bonding, holding the pellicle in the selected pellicle holding manner.

* * * * *